US012720670B2

(12) United States Patent
Oshima

(10) Patent No.: US 12,720,670 B2
(45) Date of Patent: Aug. 25, 2026

(54) SEMICONDUCTOR SUBSTRATE, METHOD FOR DESIGNING SEMICONDUCTOR SUBSTRATE, AND APPARATUS FOR MANUFACTURING SEMICONDUCTOR SUBSTRATE

(71) Applicant: NEC Corporation, Tokyo (JP)

(72) Inventor: Naoki Oshima, Tokyo (JP)

(73) Assignee: NEC CORPORATION, Tokyo (JP)

(*) Notice: Subject to any disclaimer, the term of this patent is extended or adjusted under 35 U.S.C. 154(b) by 263 days.

(21) Appl. No.: 18/382,751

(22) Filed: Oct. 23, 2023

(65) Prior Publication Data

US 2024/0147603 A1 May 2, 2024

(30) Foreign Application Priority Data

Nov. 1, 2022 (JP) ................................ 2022-175436

(51) Int. Cl.
*H05K 1/02* (2006.01)
*H05K 3/00* (2006.01)

(52) U.S. Cl.
CPC ......... *H05K 1/0243* (2013.01); *H05K 1/0287* (2013.01); *H05K 3/0005* (2013.01); *H05K 2201/09409* (2013.01)

(58) Field of Classification Search
CPC ... H05K 1/0243; H05K 1/0287; H05K 3/0005
See application file for complete search history.

(56) References Cited

U.S. PATENT DOCUMENTS

| | | | |
|---|---|---|---|
| 5,970,238 A | 10/1999 | Shibata et al. | |
| 2004/0145028 A1 | 7/2004 | Matsumoto et al. | |
| 2024/0235004 A1* | 7/2024 | Kinoshita | H01Q 21/06 |

FOREIGN PATENT DOCUMENTS

| | | |
|---|---|---|
| JP | H07-326676 A | 12/1995 |
| JP | H09-306996 A | 11/1997 |
| JP | 2004-235357 A | 8/2004 |
| JP | 2009-070843 A | 4/2009 |
| JP | 5156324 B2 | 3/2013 |

OTHER PUBLICATIONS

Japanese Office Action for JP Application No. 2022-175436, mailed on Jun. 2, 2026 with English Translation.

* cited by examiner

*Primary Examiner* — Jeremy C Norris
(74) *Attorney, Agent, or Firm* — Sughrue Mion, PLLC

(57) ABSTRACT

A semiconductor substrate according to the present disclosure includes a high-frequency circuit, in which a size of each of dummy metal pieces and an interval of an arrangement of the dummy metal pieces constituting a dummy metal piece group in a first area which is inside a line constituting a high-frequency circuit is n times larger than that of a dummy metal piece group outside a peripheral area of the high-frequency circuit; and the number of the dummy metal pieces in the first area is $1/n^2$ of the number of the dummy metal pieces outside the peripheral area, where n is a real number greater than one.

12 Claims, 6 Drawing Sheets

100
104
103
102
101
110

100
104
103
102
101
110

SEMICONDUCTOR SUBSTRATE, METHOD FOR DESIGNING SEMICONDUCTOR SUBSTRATE, AND APPARATUS FOR MANUFACTURING SEMICONDUCTOR SUBSTRATE

INCORPORATION BY REFERENCE

This application is based upon and claims the benefit of priority from Japanese patent application No. 2022-175436, filed on Nov. 1, 2022, the disclosure of which is incorporated herein in its entirety by reference.

TECHNICAL FIELD

The present disclosure relates to a semiconductor substrate, a method for designing a semiconductor substrate, an apparatus for manufacturing a semiconductor substrate, and a readable medium.

BACKGROUND ART

Japanese Patent No. 5156324 discloses a semiconductor substrate in which dummy metal pieces are arranged in a mesh pattern in a semiconductor device including a high-frequency line.

As the demand for wireless communication is increasing, it has been desired to develop a communication method and a communication apparatuses capable of using higher frequencies. Communication apparatuses using highly-integrated semiconductor substrates are suitable for communication using high frequencies, and it is expected that such communication apparatuses will enable wireless communication to be spread further.

The accuracy of the design of desired circuits in semiconductor processes has been improved by the development of circuit simulators and high frequency models provided by semiconductor vendors. For microwave ranges, especially at frequencies higher than millimeter waves, it is common to design circuits and the like by using electromagnetic-field analyses for circuits that are not included in such models provided by semiconductor vendors, and for connection lines between such models and the like.

In particular, silicon-based semiconductors are suitable for high integration. However, process rules for them become stricter as high integration progresses and the process becomes finer. In order to maintain high manufacturing accuracy, in many cases, dummy metal pieces, which are not necessary for the circuit operation, are added in order to satisfy a predetermined metal density.

In general, in the silicon-based semiconductor process, the arrangement of dummy metal pieces is determined through automatic generation by designing software or the like. However, in high-frequency circuits, in order to prevent the effect on the circuits, dummy metal pieces have been manually arranged so that they are disposed in areas distant from the desired circuit.

Although dummy metal pieces are small metal pieces, they are arranged in a large number in and around a circuit. Therefore, a large amount of calculation resources is required to carry out the analysis of dummy metal pieces, and actual values (i.e., measured values) often deviate from design values. The finer the process needs to be, the smaller the sizes of dummy metal pieces become in order to make the metal density of the circuit and that of a section adjacent thereto uniform, thus making the analysis more difficult.

The calculation amount of the above-described electromagnetic field analysis significantly depends on the range over which the analysis is performed and the mesh number which is proportional to the desired frequency. When different kinds of materials, for example, a dummy metal and a dielectric material, are used in a mixed manner in the mesh, the boundary condition becomes complicated, so that a finer mesh is required. That is, when the sizes of dummy metal pieces decrease and the amount thereof increases, the mesh number enormously increases and the electromagnetic-field analysis becomes difficult.

Further, in semiconductor processes that need to be finer, the number of cases where the metal density does not satisfy the ordinary process rules increases. As a countermeasure for such cases, for example, Japanese Patent No. 5156324 discloses that a process rule for reducing the metal density is applied to areas around high-frequency circuits which are significantly affected by the metal density, such as inductors and transformers. However, in this countermeasure, it is necessary to relax the process rules on the semiconductor vendor side.

The present disclosure has been made in view of these problems, and an object thereof is to provide a semiconductor substrate, a method for designing a semiconductor substrate, an apparatus for manufacturing a semiconductor substrate, and a non-transitory readable medium capable of solving the difficulty of an analysis that is made in a state where process rules are satisfied and a high-frequency circuit and dummy metal pieces provided around it are taken into consideration.

SUMMARY

A semiconductor substrate according to the present disclosure includes a high-frequency circuit, in which a size of each of dummy metal pieces constituting a dummy metal piece group located in a first area which is inside a line constituting a high-frequency circuit is n times larger than that of a dummy metal piece group located outside a peripheral area of the high-frequency circuit; an interval of an arrangement of the dummy metal pieces constituting the dummy metal piece group located in the first area is n times larger than that of the dummy metal piece group located outside the peripheral area of the high-frequency circuit; and the number of the dummy metal pieces constituting the dummy metal piece group located in the first area is $1/n^2$ of the number of the dummy metal pieces constituting the dummy metal piece group located outside the peripheral area of the high-frequency circuit, where n is a real number greater than one. In this way, it is possible to provide a semiconductor substrate capable of solving the difficulty of an analysis that is made in a state where process rules are satisfied, and a high-frequency circuit and dummy metal pieces provided around it are taken into consideration.

A method for designing a semiconductor substrate according to the present disclosure is a method for designing a semiconductor substrate including a high-frequency circuit and a dummy metal piece group, including: setting a mesh size for an analysis target, and calculating a mesh number; setting a size of each of dummy metal pieces constituting the dummy metal piece group so as to become n times larger, setting an interval of an arrangement of the dummy metal pieces constituting the dummy metal piece group so as to become n times larger, and setting the number of the dummy metal pieces constituting the dummy metal piece group so as to become $1/n^2$ when a required memory amount calculated from the mesh number is larger than a memory amount that can be allocated from a calculator, wherein n is a real number greater than one.

An apparatus for manufacturing a semiconductor substrate according to the present disclosure is an apparatus for manufacturing a semiconductor substrate including a high-frequency circuit and a dummy metal piece group, including: an analysis/determination unit, a design unit, a communication unit, and a manufacturing unit, in which the analysis/determination unit is configured to set a mesh size for an analysis target, calculates a mesh number, and determines whether or not a required memory amount calculated from the mesh number is larger than a memory amount that can be allocated from a calculator, the design unit is configured to design the dummy metal piece group so that: a size of each of dummy metal pieces constituting the dummy metal piece group becomes n times larger; an interval of an arrangement of the dummy metal pieces constituting the dummy metal piece group becomes n times larger; and the number of the dummy metal pieces constituting the dummy metal piece group becomes $1/n^2$, n is a real number greater than one, the communication unit is configured to transmit/receive design data, and the manufacturing unit is configured to manufacture a semiconductor substrate based on the design data.

A non-transitory computer readable medium according to the present disclosure is a computer readable medium storing a program for performing a method for designing a semiconductor substrate including a high-frequency circuit and a dummy metal piece group, the program being configured to cause a computer to:

set a mesh size for an analysis target, and calculate a mesh number;

set a size of each of dummy metal pieces constituting the dummy metal piece group so as to become n times larger, set an interval of an arrangement of the dummy metal pieces constituting the dummy metal piece group so as to become n times larger, and set the number of the dummy metal pieces constituting the dummy metal piece group so as to become $1/n^2$ when a required memory amount calculated from the mesh number is larger than a memory amount that can be allocated from a calculator, where n is a real number greater than one.

BRIEF DESCRIPTION OF DRAWINGS

The above and other aspects, features and advantages of the present disclosure will become more apparent from the following description of certain example embodiments when taken in conjunction with the accompanying drawings, in which.

EXAMPLE EMBODIMENT

First Example Embodiment

Figure 1A:
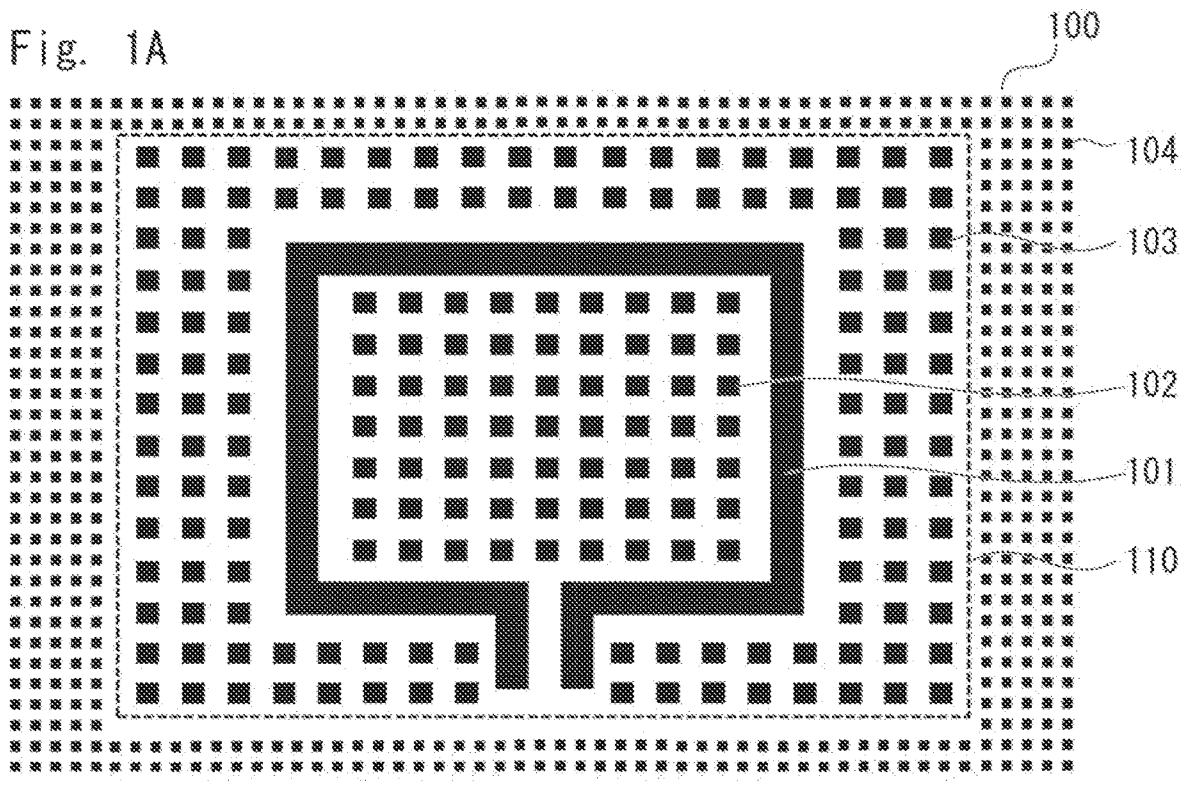
FIGS. 1A and 1B are diagrams for explaining an arrangement of a semiconductor substrate and dummy metal pieces according to a first example embodiment.

An example embodiment according to the present disclosure will be described hereinafter with reference to the drawings. Each of FIGS. 1A and 1B shows an arrangement of a semiconductor substrate and dummy metal pieces according to this example embodiment.

A semiconductor substrate 100 according to this example embodiment is a semiconductor substrate on which a high-frequency circuit is mounted (or formed), and includes a line 101 constituting a high-frequency circuit, and dummy metal pieces 102, 103 and 104. Dotted lines in the drawing indicate a peripheral area 110 of the high-frequency circuit.

In this example embodiment, an area inside the line 101 constituting the high-frequency circuit is referred to as a first area, and a set of dummy metal pieces 102 arranged inside the first area is referred to as a first dummy metal piece group. An area outside the first area and inside the peripheral area 110 is referred to as a second area, and a set of dummy metal pieces 103 arranged inside the second area is referred to as a second dummy metal piece group. An area outside the peripheral area 110 is referred to as a third area, and a set of dummy metal pieces 104 arranged inside the third area is referred to as a third dummy metal piece group.

Figure 1B:
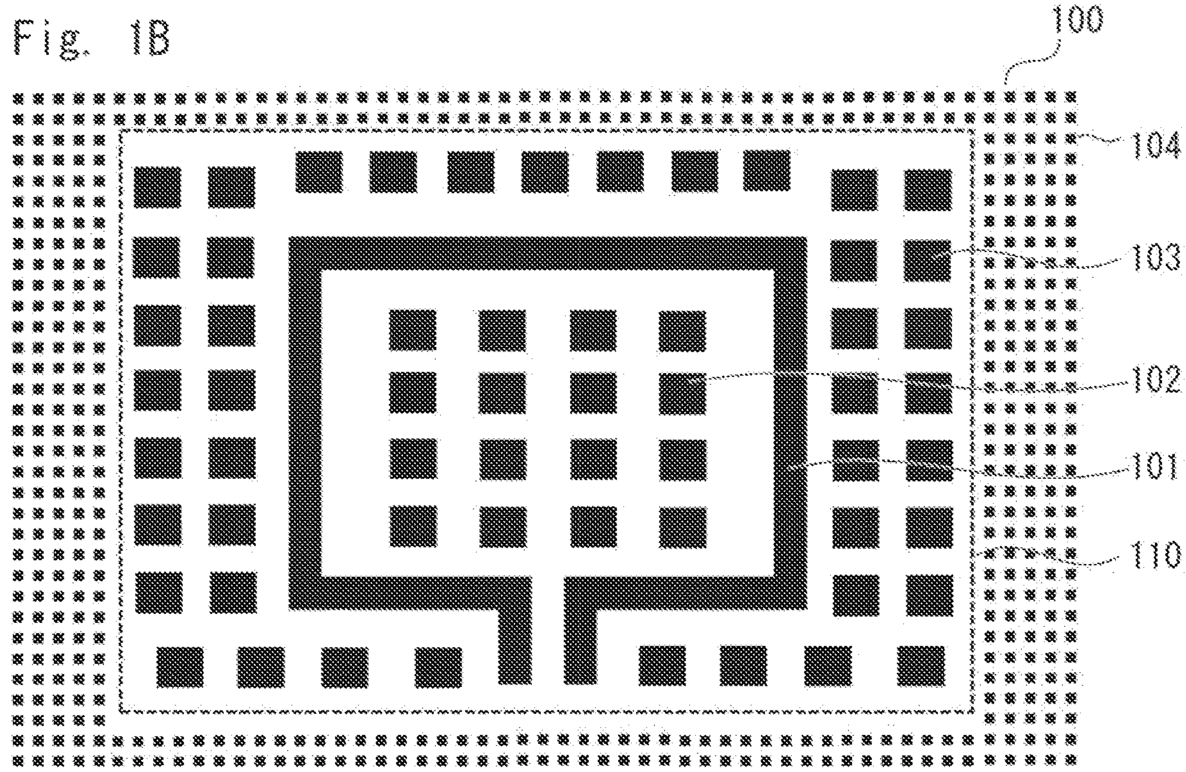

FIG. 1A shows an example in which: the size of each of the dummy metal pieces 102 and 103 constituting the first and second dummy metal piece groups is two times larger than that of the dummy metal pieces 104 constituting the third dummy metal piece group; and an interval of the arrangement of the dummy metal pieces 102 and 103 constituting the first and second dummy metal piece groups is two times larger than that of the dummy metal pieces 104 constituting the third dummy metal piece group; and the number of the dummy metal pieces 102 and 103 constituting the first and second dummy metal piece groups is $\frac{1}{2}^2$, i.e., ¼, of the number of the dummy metal pieces 104 constituting the third dummy metal piece group.

FIG. 1B shows an example in which: the size of each of the dummy metal pieces 102 and 103 constituting the first and second dummy metal piece groups is four times larger than that of the dummy metal pieces 104 constituting the third dummy metal piece group; and an interval of the arrangement of the dummy metal pieces 102 and 103 constituting the first and second dummy metal piece groups is four times larger than that of the dummy metal pieces 104 constituting the third dummy metal piece group; and the number of the dummy metal pieces 102 and 103 constituting the first and second dummy metal piece groups is $\frac{1}{4}^2$, i.e., 1/16, of the number of the dummy metal pieces 104 constituting the third dummy metal piece group.

By adopting the above-described configuration, it is possible to make the metal density in the first and second areas and that in the third area roughly equal to each other. That is, it is possible to maintain the metal density in the high-frequency circuit and that around the high-frequency circuit constant. As a result, it is possible to satisfy the process rules and facilitate the analysis in the state including dummy metal pieces at the same time.

The above-described relationship between the size of each of the dummy metal pieces 102 and 103 and the interval of the arrangement of them and those of the dummy metal pieces 104 is merely an example, and the effect described in this example embodiment can be obtained as long as the size is n times larger and the number is $1/n^2$, where n is a real number greater than one. That is, it is important in this example embodiment to increase the size of each of the dummy metal pieces 102 and 103 and the interval of the arrangement of them as compared with those of the dummy metal pieces 104. Further, although the shape of each of dummy metal pieces is a square in the above description, similar effects can be obtained even when they have a shape other than the square such as a rectangle.

In FIGS. 1A and 1B, although the size and the interval of the arrangement of the dummy metal pieces 102 and those of the dummy metal pieces 103 are roughly equal to each other, the present disclosure is not limited to such a configuration. That is, as long as the size of each of the dummy metal pieces 102 and 103 and the interval of the arrangement of them are larger than those of the dummy metal pieces 104, the relationship between the size and the interval of the arrangement of the dummy metal pieces 102 and those of the dummy metal pieces 103 can be arbitrarily determined.

Figure 2:
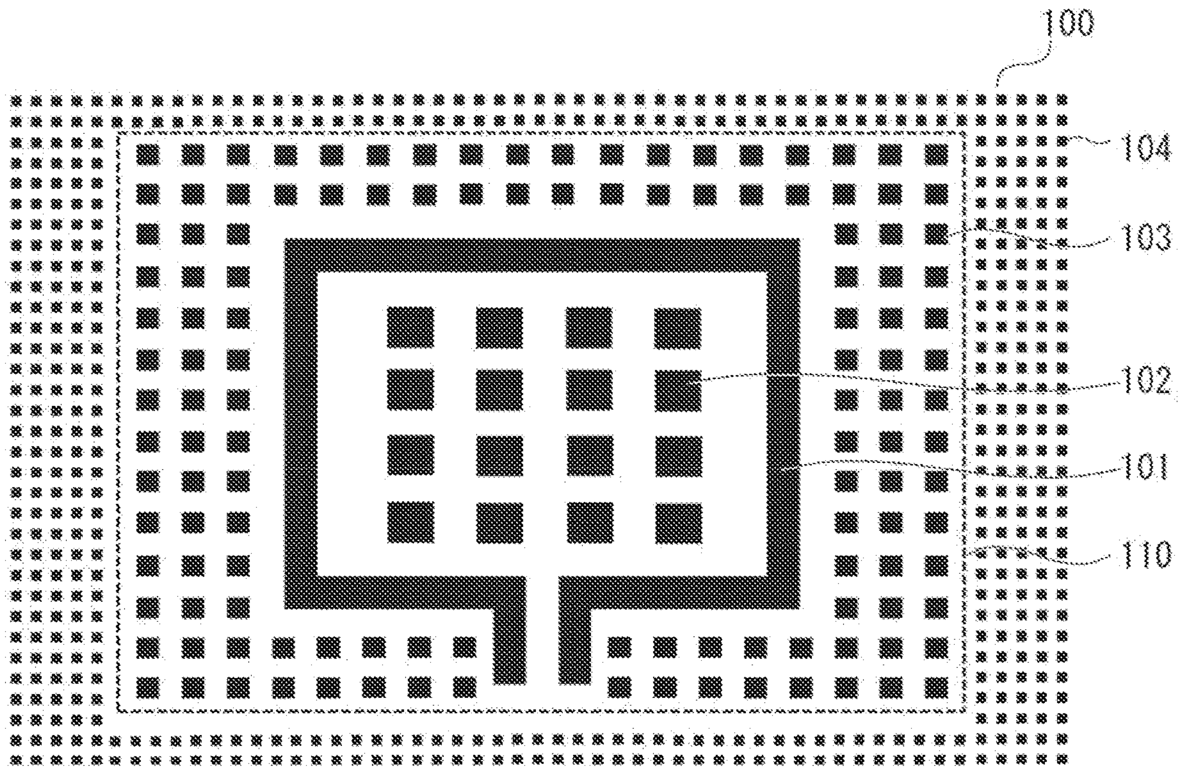
FIG. 2 is a diagram for explaining an arrangement of a semiconductor substrate and dummy metal pieces according to the first example embodiment.

A semiconductor substrate 100 shown in FIG. 2 is an example in which: the size of each of dummy metal pieces 102 is two times larger than that of the dummy metal pieces 104; the interval of the arrangement of the dummy metal pieces 102 is two times larger than that of the dummy metal pieces 104; the number is ¼ of that of the dummy metal pieces 104; the size of each of dummy metal pieces 103 is four times larger than that of the dummy metal pieces 104; the interval of the arrangement of the dummy metal pieces 103 is four times larger than that of the dummy metal pieces 104; and the number is 1/16 of the dummy metal pieces 104. Even in the above-described configuration, the metal densities of the first area, second, and third areas are roughly equal to each other, so that similar effects can be obtained.

In other words, in the semiconductor substrate 100 shown in FIG. 2, as compared with the dummy metal pieces 104, the size of each of the dummy metal pieces 102 is n times larger; the interval of the arrangement of the dummy metal pieces 102 are n times larger; the number is $1/n^2$; the size of each of the dummy metal pieces 103 are m times larger; the interval of the arrangement of the dummy metal pieces 103 are m times larger; and the number is $1/m^2$, where n and m are real numbers greater than one. The values n and m may be different from each other or equal to each other.

Although an example in which the size of each of the dummy metal pieces 102 is larger than that of each of the dummy metal pieces 103 is shown in FIG. 2, needless to say, similar effects can be obtained even when the size of each of the dummy metal pieces 103 is larger than that of the dummy metal pieces 102.

In this way, it is possible to provide a semiconductor substrate capable of solving the difficulty of an analysis that is made in a state where process rules are satisfied, and a high-frequency circuit and dummy metal pieces provided around it are taken into consideration.

Figure 3:
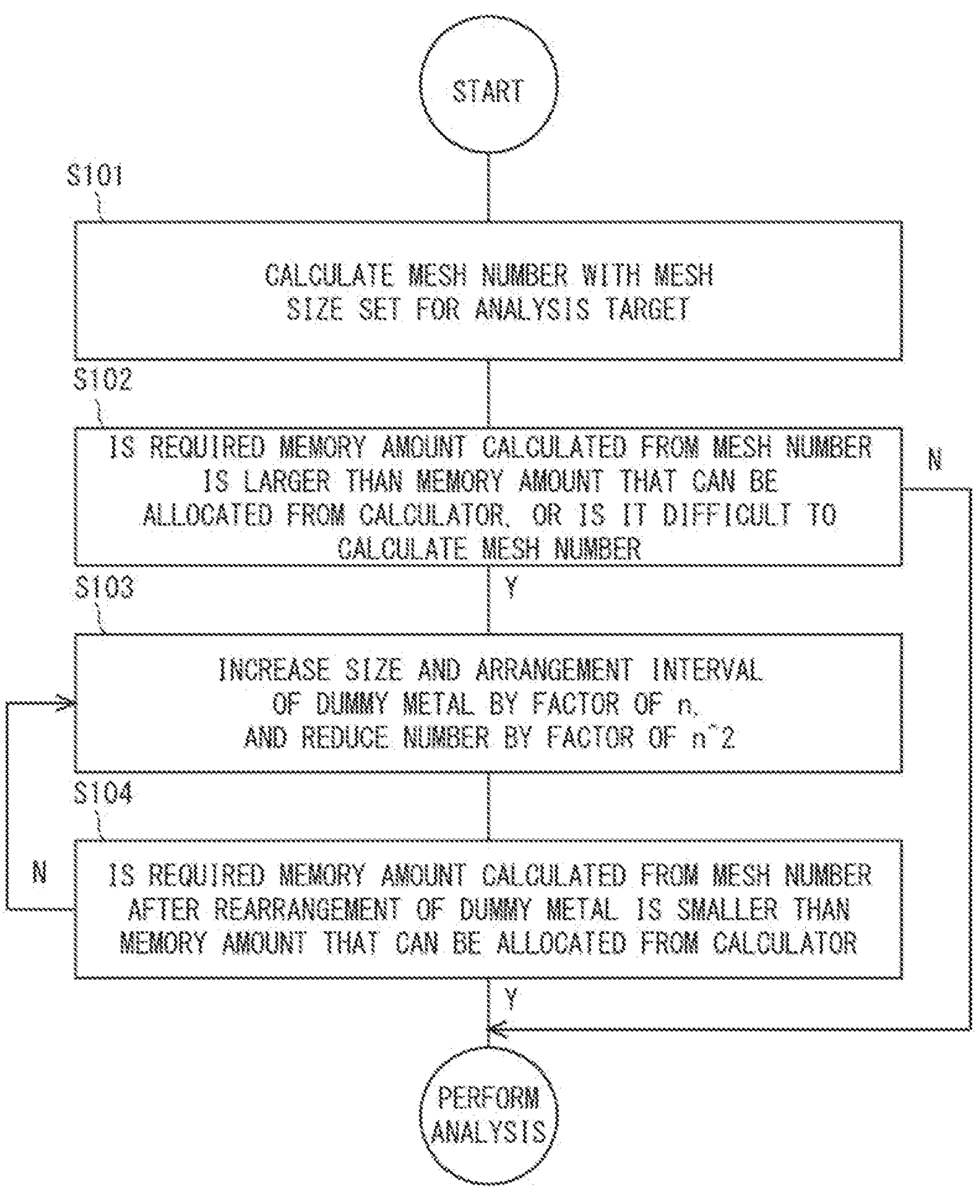
FIG. 3 is a flowchart showing a method for designing a semiconductor substrate according to the first example embodiment.

Next, a method for designing a semiconductor substrate according to this example embodiment will be described. FIG. 3 is a flowchart showing a method for designing a semiconductor according to this example embodiment. This designing method roughly consists of an analysis step by an electromagnetic-field analysis or the like, and a design step in which the result of the analysis is taken into consideration.

Firstly, an analysis target, i.e., a high-frequency circuit in this example embodiment, is divided into small areas (mesh). Then, the size of the mesh is set and the mesh number is calculated (S101). The mesh number depends on the algorithm of the simulator, the frequency, the shape of the mesh, and the like. In many cases, the shape of the mesh is, for example, a regular tetrahedron in a 3D (three-dimensional) analysis.

Next, a required memory amount is calculated from the mesh number, and it is determined whether the calculated required memory amount exceeds a memory amount allocated from a calculator (S102). When the required memory amount is smaller than the allocated memory amount, it is possible to make an analysis, so that the analysis is performed. When the required memory amount is larger than the allocated memory amount, or when it is difficult to calculate the mesh number in the first place, it is impossible to make an analysis, so that the process proceeds to the next step.

Next, the size of each of the dummy metal pieces constituting the dummy metal piece group located inside the line constituting the high-frequency circuit and those located inside the peripheral area of the high-frequency circuit, and the interval of the arrangement of these dummy metal pieces are both increased by a factor of n (S103). The value n is a real number greater than one. In this way, the total number of the dummy metal pieces inside the line constituting the high-frequency circuit and those inside the peripheral area of the high-frequency circuit is reduced to $1/n^2$ of the total number of the original dummy metal pieces.

By changing the size, the interval of the arrangement, and the number of the dummy metal pieces as described above, it is possible to reduce the number of the dummy metal pieces and maintain the total area of the dummy metal pieces (the area in the plan view in this example) constant at the same time. Therefore, it is possible to maintain the metal density of the dummy metal pieces constant even after the above-described change.

Next, the mesh number is calculated for the analysis target in which the size of each of the dummy metal pieces has been changed, i.e., the dummy metal pieces have been rearranged. A required memory amount is calculated from the mesh number, and it is determined whether or not the calculated required memory amount is smaller than a memory amount allocated from a calculator. Then, when the required memory amount is smaller than the allocated memory amount, an analysis is performed (S104). When the required memory amount is larger than the memory amount allocated from the calculator, the above-described size change of each of the dummy metal pieces is repeated until the mesh number reaches a calculable number. Eventually, when the desired characteristics are achieved, the circuit is completed, and the result of the analysis is taken into consideration in the design.

Figure 4:
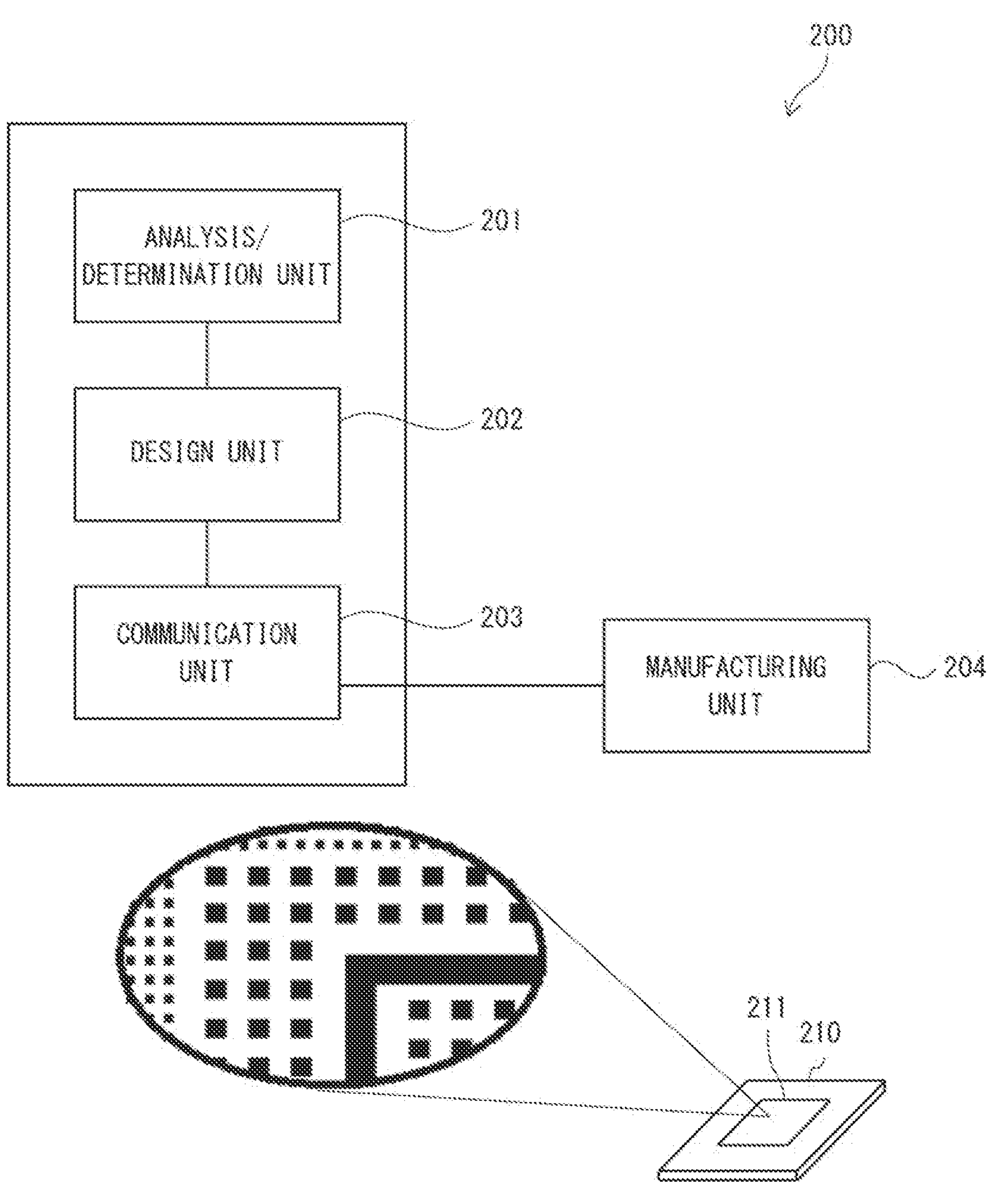
FIG. 4 is a diagram for explaining an apparatus for manufacturing a semiconductor substrate according to the first example embodiment.

Further, as shown in FIG. 4, the above-described process may be performed in an apparatus for manufacturing a semiconductor substrate. An apparatus for manufacturing a semiconductor substrate 200 (hereinafter also referred to as a manufacturing apparatus 200) includes an analysis/determination unit 201 that makes an analysis and a decision, a design unit 202 that designs a circuit and an arrangement of dummy metal pieces based on the obtained result of the analysis, a communication unit 203 that transmits/receives design data, and a manufacturing unit 204 that manufactures a semiconductor substrate based on the design data. The manufacturing apparatus 200 forms an area 211 and the like in which a circuit or the like is formed on a semiconductor substrate 210 based on the design data.

Note that although the size of the dummy metal pieces inside the line constituting the high-frequency circuit and the size of the dummy metal pieces inside the peripheral area of the high-frequency circuit are increased by a factor of n at the same time for simplifying the explanation, the present disclosure is not limited to this configuration. That is, the sizes of the dummy metal pieces constituting the dummy metal piece groups may be changed independently of each other.

In other words, the size and the interval of the arrangement of the dummy metal piece group inside the line constituting the high-frequency circuit may be increased by a factor of n, and the size and the interval of the arrangement of the dummy metal piece group inside the peripheral area of the high-frequency circuit may be increased by a factor of m. The values n and m are real numbers greater than one, and they may be different from each other or equal to each other.

In this way, it is possible to provide a method for designing a semiconductor substrate capable of solving the difficulty of an analysis that is made in a state where process rules are satisfied, and a high-frequency circuit and dummy metal pieces provided around it are taken into consideration. Further, the above-described feature contributes to the improvement of electrical characteristics and accuracy in the manufacturing of a semiconductor substrate and to the reduction of the design lead time, so that its effect is significant.

Second Example Embodiment

In this example embodiment, a modified example of the method for designing a semiconductor according to the first example embodiment will be described. Components and processes similar to those of the first example embodiment may be omitted as appropriate to avoid redundant explanations.

The larger the size of each of dummy metal pieces is, the more the size of the mesh can be increased in an analysis such as an electromagnetic-field analysis, and the more the calculation load of the analysis can be reduced. Meanwhile, the smaller the size of the mesh is, the smaller the effect on the periphery of the desired circuit becomes.

Therefore, in order to suppress the effect of dummy metal pieces on circuits located around the desired circuit, the size of each of dummy metal pieces adjacent to or sufficiently close to nearby circuits is kept unchanged, and only the size of each of the other dummy metal pieces is changed. In this way, it is possible to perform an analysis only in a desired circuit with a small calculation load, while keeping the characteristics of the nearby circuits unchanged from when the smaller dummy metal pieces.

Figure 5:
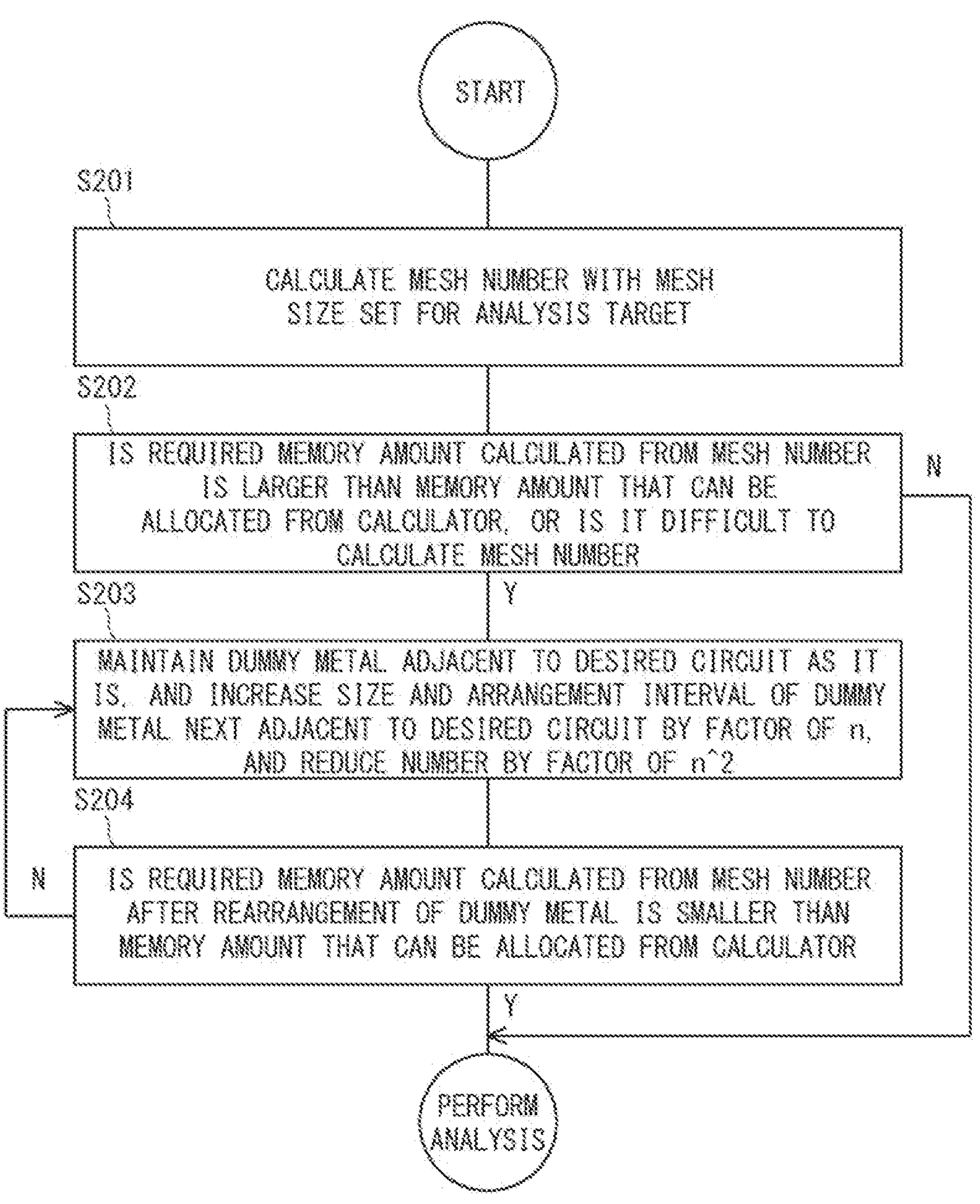
FIG. 5 is a flowchart showing a method for designing a semiconductor according to a second example embodiment.

Specific processes will be described. FIG. 5 is a flowchart showing a method for designing a semiconductor substrate according to this example embodiment. The division of the analysis target into mesh and the setting of the mesh size (S201) are similar to those in the step S101 in the first example embodiment. The calculation of the required memory amount from the mesh number, and the determination as to whether or not the calculated required memory amount is smaller than the memory amount allocated from the calculator (S202) are similar to those in the step S102 in the first example embodiment. When the required memory amount is smaller than the allocated memory amount, it is possible to make an analysis, so that the analysis is performed. When the required memory amount is larger than the allocated memory amount, or when it is difficult to calculate the mesh number in the first place, it is impossible to make an analysis, so that the process proceeds to the next step.

Next, dummy metal pieces adjacent to the desired circuit are not changed, and the size of each of dummy metal pieces adjacent to the dummy metal piece group adjacent to the dummy metal pieces (hereinafter also referred to as the next adjacent dummy metal pieces), and the interval of the arrangement of them are increased by a factor of n (S203). As a result, the total number of the next adjacent dummy metal pieces is decreased by a factor of n 2 as compared with the total number of the dummy metal pieces adjacent to the desired circuit. Therefore, it is possible to reduce the number of the dummy metal pieces and maintain the total area of the dummy metal pieces constant at the same time.

Next, the mesh number of the analysis target in which the dummy metal pieces have been rearranged is calculated; a required memory amount is calculated from the mesh number; and it is determined whether or not the calculated required memory amount is smaller than the memory amount allocated from the calculator. Then, when the required memory amount is smaller than the allocated memory amount, an analysis is performed (S204). When the required memory amount is larger than the memory amount allocated from the calculator, the above-described size change of the dummy metal pieces is repeated until the mesh number reaches a calculable number. Eventually, when the desired characteristics are achieved, the circuit is completed, and the result of the analysis is taken into consideration in the design.

In this way, it is possible to provide a method for designing a semiconductor substrate capable of performing an analysis only in a desired circuit with a small calculation load, while keeping the characteristics of the nearby circuits unchanged from when the smaller dummy metal pieces.

Third Example Embodiment

Similar to the second example embodiment, a modified example of the method for designing a semiconductor according to the first example embodiment will be described. Components and processes similar to those of the first and second example embodiments may be omitted to avoid redundant explanations.

As described in the second example embodiment, the smaller the size of the dummy metal pieces is, the smaller the effect on the periphery thereof becomes. When the calculator used for an analysis such as an electromagnetic-field analysis has sufficient memory amount or the like, it is possible to, by making the dummy metal pieces smaller, reduce the effect on the periphery thereof.

Figure 6:
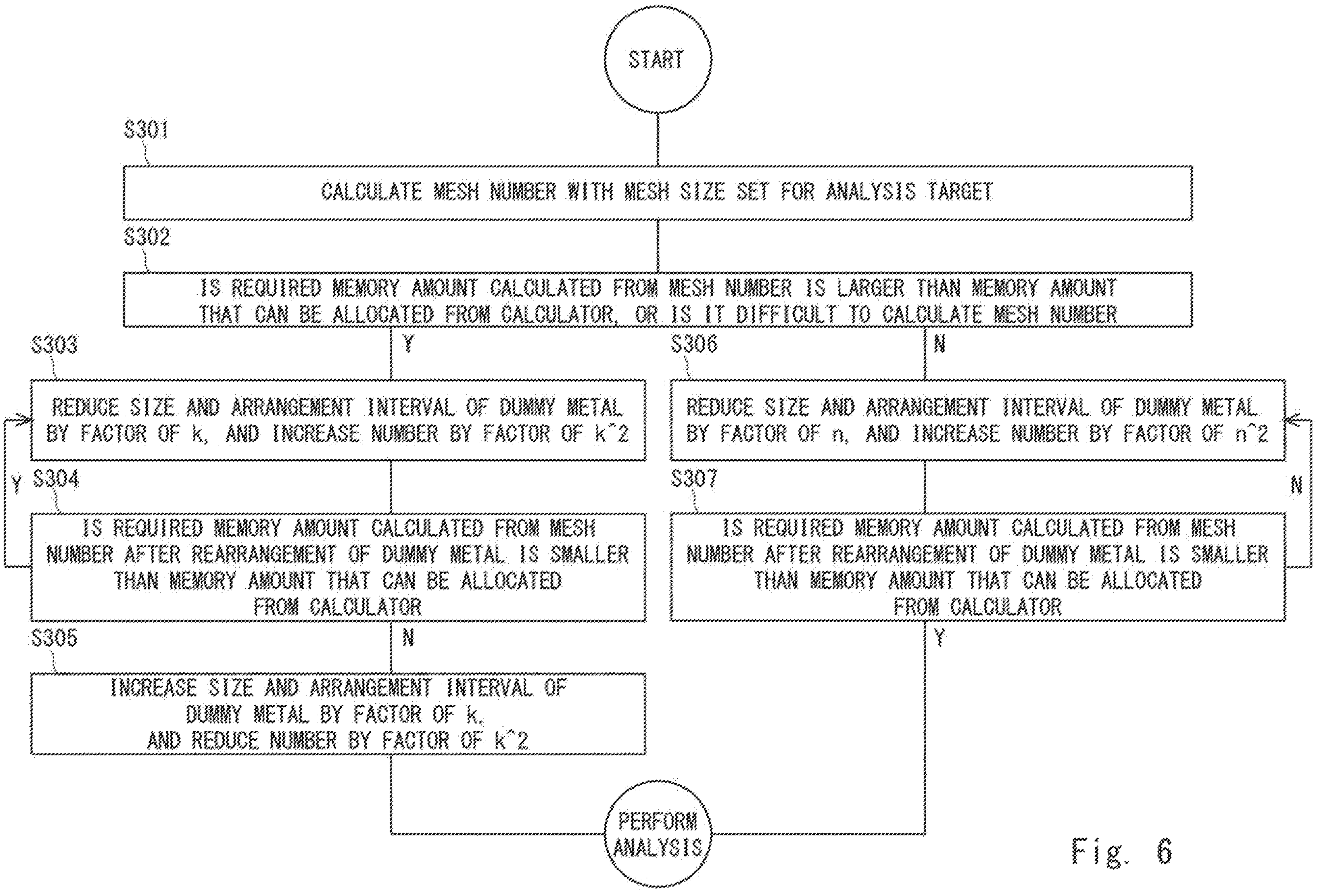
FIG. 6 is a flowchart showing a method for designing a semiconductor according to a third example embodiment.

FIG. 6 is a flowchart showing a method for designing a semiconductor according to this example embodiment. The analysis target is divided into a mesh and the mesh size is set (S301); a required memory amount is calculated from the mesh number; and it is determined whether or not the calculated required memory amount is smaller than the memory amount allocated from the calculator (S302). When the required memory amount is smaller than the allocated memory amount, the process proceeds to the next step. On the other hand, when the required memory amount is larger than the allocated memory amount, the process proceeds to a step for increasing the size of each of the dummy metal pieces and the interval of the arrangement of them (S306) as in the case of the first and second example embodiments. This step is repeated until it is determined that the required memory amount calculated after the rearrangement of the dummy metal pieces becomes smaller than the allocated memory amount (S307). After that, an analysis is performed.

When the required memory amount is smaller than the amount of the memory allocated from the calculator, i.e., when an analysis can be made, the size of each of the dummy metal pieces and the interval of the arrangement of them are set so that they are both reduced by a factor of k, and the total number is increased by a factor of $k^2$ (S303). The value k is a real number greater than one.

Next, it is determined whether or not the required memory amount calculated from the mesh number calculated after the rearrangement of the dummy metal pieces is smaller than the amount of the memory that can be allocated from the calculator (S304). When the required memory amount is smaller than the allocated memory amount, the calculator has sufficient memory amount, so that the size of each of dummy metal pieces and the interval of the arrangement of them are further reduced, and the determination step is repeated (S303, S304).

When the required memory amount becomes larger than the allocated memory amount, the size of each of the dummy metal pieces and the interval of the arrangement of them are both increased by a factor of k and the total number is reduced by a factor of $k^2$ (S305). That is, this step is a step for returning the size of each of the dummy metal pieces to the size with which it is possible to make an analysis. After that, an analysis is performed.

In this way, it is possible to make dummy metal pieces smaller, and hence to reduce the effect on the periphery thereof. Therefore, it is possible to design dummy metal pieces that can be analyzed and do not significantly affect the periphery thereof.

Note that the present disclosure is not limited to the above-described example embodiments, and they can be modified as appropriate without departing the scope and spirit of the disclosure.

According to the present disclosure, it is possible to provide a semiconductor substrate, a method for designing a semiconductor substrate, an apparatus for manufacturing a semiconductor substrate, and a readable medium capable of solving the difficulty of an analysis that is made in a state where process rules are satisfied, and a high-frequency circuit and dummy metal pieces provided around it are taken into consideration.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g., magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

The first and second example embodiments can be combined as desirable by one of ordinary skill in the art.

While the disclosure has been particularly shown and described with reference to embodiments thereof, the disclosure is not limited to these embodiments. It will be understood by those of ordinary skill in the art that various changes in form and details may be made therein without departing from the spirit and scope of the present disclosure as defined by the claims.

The whole or part of the example embodiments disclosed above can be described as, but not limited to, the following supplementary notes.

(Supplementary Note 1) A semiconductor substrate comprising a high-frequency circuit, wherein a size of each of dummy metal pieces constituting a dummy metal piece group located in a first area which is inside a line constituting a high-frequency circuit is n times larger than that of a dummy metal piece group located outside a peripheral area of the high-frequency circuit; an interval of an arrangement of the dummy metal pieces constituting the dummy metal piece group located in the first area is n times larger than that of the dummy metal piece group located outside the peripheral area of the high-frequency circuit; and the number of the dummy metal pieces constituting the dummy metal piece group located in the first area is $1/n^2$ of the number of the dummy metal pieces constituting the dummy metal piece group located outside the peripheral area of the high-frequency circuit, where n is a real number greater than one.

(Supplementary Note 2) The semiconductor substrate according to Supplementary Note 1, wherein a metal density of the dummy metal piece group located in the first area is similar to that of the dummy metal piece group located outside the peripheral area.

(Supplementary Note 3) The semiconductor substrate according to Supplementary Note 1 or 2, wherein the size of each of dummy metal pieces constituting the dummy metal piece group located in the second area which is outside the first area and inside the peripheral area is m times larger than that of the dummy metal piece group located outside the peripheral area; an interval of an arrangement of the dummy metal pieces constituting the dummy metal piece group located in the second area is m times larger than that of the dummy metal piece group located outside the peripheral area; and the number of the dummy metal pieces constituting the dummy metal piece group located in the second area is $1/m^2$ of the number of the dummy metal pieces constituting the dummy metal piece group located outside the peripheral area, where m is a real number greater than one.

(Supplementary Note 4) The semiconductor substrate according to Supplementary Note 3, wherein a metal density of the dummy metal piece group in the second area is similar to that of the dummy metal piece group outside the peripheral area.

(Supplementary Note 5) The semiconductor substrate according to Supplementary Note 3, wherein the m is equal to the n.

(Supplementary Note 6). A method for designing a semiconductor substrate comprising a high-frequency circuit and a dummy metal piece group, comprising:

setting a mesh size for an analysis target, and calculating a mesh number;

setting a size of each of dummy metal pieces constituting the dummy metal piece group so as to become n times larger, setting an interval of an arrangement of the dummy metal pieces constituting the dummy metal piece group so as to become n times larger, and setting the number of the dummy metal pieces constituting the dummy metal piece group so as to become $1/n^2$ when a required memory amount calculated from the mesh number is larger than a memory amount that can be allocated from a calculator, wherein n is a real number greater than one.

(Supplementary Note 7) The method for manufacturing a semiconductor substrate according to Supplementary Note 6, wherein a metal density of the dummy metal piece group is roughly equal to that of the dummy metal piece group outside the high-frequency circuit.

(Supplementary Note 8) An apparatus for manufacturing a semiconductor substrate comprising a high-frequency circuit and a dummy metal piece group, comprising:

an analysis/determination unit, a design unit, a communication unit, and a manufacturing unit, wherein the analysis/determination unit is configured to set a mesh size for an analysis target, calculates a mesh number, and determines whether or not a required memory amount calculated from the mesh number is larger than a memory amount that can be allocated from a calculator, the design unit is configured to design the dummy metal piece group so that: a size of each of dummy metal pieces constituting the dummy metal piece group becomes n times larger; an interval of an arrangement of the dummy metal pieces constituting the dummy metal piece group becomes n times larger; and the number of the dummy metal pieces constituting the dummy metal piece group becomes $1/n^2$, n is a real number greater than one, the communication unit is configured to transmit/receive design data, and the manufacturing unit is configured to manufacture a semiconductor substrate based on the design data.

(Supplementary Note 9) The apparatus for manufacturing a semiconductor substrate according to Supplementary Note 8, wherein a metal density of the dummy metal piece group is roughly equal to that of the dummy metal piece group outside the high-frequency circuit.

(Supplementary Note 10) A non-transitory computer readable medium storing a program for performing a method for designing a semiconductor substrate including a high-frequency circuit and a dummy metal piece group, the program being configured to cause a computer to:

set a mesh size for an analysis target, and calculate a mesh number;

set a size of each of dummy metal pieces constituting the dummy metal piece group so as to become n times larger, set an interval of an arrangement of the dummy metal pieces constituting the dummy metal piece group so as to become n times larger, and set the number of the dummy metal pieces constituting the dummy metal piece group so as to become $1/n^2$ when a required memory amount calculated from the mesh number is larger than a memory amount that can be allocated from a calculator, where n is a real number greater than one.

Some or all of elements (e.g., structures and functions) specified in Supplementary Notes 2 to 5 dependent on Supplementary Note 1 (e.g., a semiconductor substrate) may also be dependent on Supplementary Note 6 (e.g., a method), Supplementary Note 8 (e.g., an apparatus), and Supplementary Note 10 (e.g., a program) in dependency similar to that of Supplementary Notes 2 to 5 on Supplementary Note 1. Some or all of elements specified in any of Supplementary Notes may be applied to various types of hardware, software, and recording means for recording software, systems, and methods.

What is claimed is:

1. A semiconductor substrate comprising a high-frequency circuit, wherein a size of each of dummy metal pieces constituting a dummy metal piece group located in a first area which is inside a line constituting a high-frequency circuit is n times larger than that of a dummy metal piece group located outside a peripheral area of the high-frequency circuit; an interval of an arrangement of the dummy metal pieces constituting the dummy metal piece group located in the first area is n times larger than that of the dummy metal piece group located outside the peripheral area of the high-frequency circuit; and the number of the dummy metal pieces constituting the dummy metal piece group located in the first area is $1/n^2$ of the number of the dummy metal pieces constituting the dummy metal piece group located outside the peripheral area of the high-frequency circuit, where n is a real number greater than one.

2. The semiconductor substrate according to claim 1, wherein a metal density of the dummy metal piece group located in the first area is similar to that of the dummy metal piece group located outside the peripheral area.

3. The semiconductor substrate according to claim 1, wherein the size of each of dummy metal pieces constituting the dummy metal piece group located in the second area which is outside the first area and inside the peripheral area is m times larger than that of the dummy metal piece group located outside the peripheral area; an interval of an arrangement of the dummy metal pieces constituting the dummy metal piece group located in the second area is m times larger than that of the dummy metal piece group located outside the peripheral area; and the number of the dummy metal pieces constituting the dummy metal piece group located in the second area is $1/m^2$ of the number of the dummy metal pieces constituting the dummy metal piece group located outside the peripheral area, where m is a real number greater than one.

4. The semiconductor substrate according to claim 3, wherein a metal density of the dummy metal piece group in the second area is similar to that of the dummy metal piece group outside the peripheral area.

5. The semiconductor substrate according to claim 3, wherein the m is equal to the n.

6. The semiconductor substrate according to claim 1, wherein the dummy metal pieces are formed in a same layer as the line constituting the high-frequency circuit.

7. A method for designing a semiconductor substrate comprising a high-frequency circuit and a dummy metal piece group, comprising:

setting a mesh size for an analysis target, and calculating a mesh number;

setting a size of each of dummy metal pieces constituting the dummy metal piece group so as to become n times larger, setting an interval of an arrangement of the dummy metal pieces constituting the dummy metal piece group so as to become n times larger, and setting the number of the dummy metal pieces constituting the dummy metal piece group so as to become $1/n^2$ when a required memory amount calculated from the mesh number is larger than a memory amount that can be allocated from a calculator, wherein n is a real number greater than one.

8. The method for manufacturing a semiconductor substrate according to claim 7, wherein a metal density of the dummy metal piece group is roughly equal to that of the dummy metal piece group outside the high-frequency circuit.

9. The method for manufacturing a semiconductor substrate according to according to claim 7, wherein the dummy metal pieces are formed in a same layer as the line constituting the high-frequency circuit.

10. An apparatus for manufacturing a semiconductor substrate comprising a high-frequency circuit and a dummy metal piece group, comprising:

an analysis/determination unit, a design unit, a communication unit, and a manufacturing unit, wherein the analysis/determination unit is configured to set a mesh size for an analysis target, calculates a mesh number, and determines whether or not a required memory amount calculated from the mesh number is larger than a memory amount that can be allocated from a calculator, the design unit is configured to design the dummy metal piece group so that: a size of each of dummy metal pieces constituting the dummy metal piece group becomes n times larger; an interval of an arrangement of the dummy metal pieces constituting the dummy metal piece group becomes n times larger; and the number of the dummy metal pieces constituting the dummy metal piece group becomes $1/n^2$, n is a real number greater than one, the communication unit is configured to transmit/receive design data, and the manufacturing unit is configured to manufacture a semiconductor substrate based on the design data.

11. The apparatus for manufacturing a semiconductor substrate according to claim 10, wherein a metal density of the dummy metal piece group is roughly equal to that of the dummy metal piece group outside the high-frequency circuit.

12. The apparatus for manufacturing a semiconductor substrate according to claim 10, wherein the dummy metal pieces are formed in a same layer as the line constituting the high-frequency circuit.

* * * * *